United States Patent [19]

Machida et al.

[11] Patent Number: 5,665,960
[45] Date of Patent: Sep. 9, 1997

[54] PHOTOELECTRIC CONVERTER DEVICE AND METHOD OF MANUFACTURING THE SAME

[75] Inventors: Satoshi Machida; Yukito Kawahara; Masahiro Yokomichi; Yoshikazu Kojima, all of Chiba, Japan

[73] Assignee: Seiko Instruments Inc., Chiba, Japan

[21] Appl. No.: 618,837

[22] Filed: Mar. 20, 1996

[30] Foreign Application Priority Data

Mar. 22, 1995 [JP] Japan ................. 7-063229

[51] Int. Cl.$^6$ ................. H01J 40/14
[52] U.S. Cl. ................. 250/214.1; 250/214 P; 250/208.1; 257/462
[58] Field of Search ................. 250/214.1, 214 P, 250/214 R, 208.1, 214 C, 349, 338.1, 338.4, 339.06; 257/462, 451; 356/4.06, 221, 218; 327/187, 514, 509

[56] References Cited

U.S. PATENT DOCUMENTS

5,008,544  4/1991  Nicolas et al. ................. 250/349
5,241,575  8/1993  Miyatake et al. ................. 257/462

*Primary Examiner*—Que Le
*Attorney, Agent, or Firm*—Loeb & Loeb LLP

[57] ABSTRACT

A photoelectric converter device having improved residual image characteristics and composed of a transistor having a control electrode region made of a semiconductor of a first conductivity type for accumulating carriers generated by an electromagnetic wave emitted by an object to be detected, a first main electrode region made of a semiconductor of a second conductivity type, and a second main electrode region made of a semiconductor of the second conductivity type, for performing an operation to accumulate the carriers, an operation of reading signals based on the carriers, and an operation of extinguishing the carriers, wherein carriers other than those generated by the electromagnetic wave emitted by the object to be detected are generated in or injected into the control electrode region. Thus, since the amount of excess majority carriers in the control electrode region after the extinguishing operation is always kept substantially constant, improved residual image characteristics are obtained.

5 Claims, 5 Drawing Sheets

IRRADIATED LIGHT AMOUNT

PHOTOELECTRIC CONVERTER DEVICE AND METHOD OF MANUFACTURING THE SAME

BACKGROUND OF THE INVENTION

1. Field of the Invention

The present invention relates to photoelectric converter devices and, more particularly, to a photoelectric converter device for accumulating carriers generated as a result of the incidence of light and for reading a signal based on the accumulated carriers which is used for solid-state camera devices, image input devices, facsimile machines, digital copiers, etc.

2. Description of the Related Art

Figure 4:
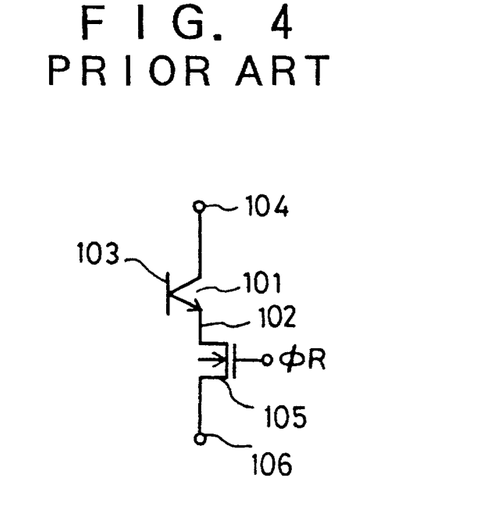
FIG. 4 is an equivalent circuit diagram of a conventional photoelectric converter device.

Conventional photoelectric converter devices include, for example, that disclosed in Japanese Patent Laid-Open No. H6-292087. FIG. 4 is an equivalent circuit diagram of the photoelectric converter device disclosed in that publication. In FIG. 4, an emitter region 102 of an NPN bipolar transistor 101 is connected to a drain of an N channel MOS transistor 105. A source electrode 106 of the MOS transistor 105 is connected to ground or to a constant voltage source at a low potential. Turn on and turn off of the MOS transistor 105 is controlled by a signal φR. The collector region 104 of transistor 101 is kept at a positive potential, while its base region 103 is always floating.

The operation of this photoelectric converter device will now be described.

First, an accumulating operation is started when the MOS transistor 105 is placed in a non-conducting state.

At this time, the emitter region 102 is in a floating state wherein it is initially at ground potential, and the base region 103 is set in a floating state wherein it is at a positive potential. Base region 103 provides the light receiving surface for the converter. When light enters in this state, carriers (holes) are accumulated in the base region 103 in an amount corresponding to the amount of the light. The potential of the emitter region 102 assumes a value which depends on the carriers accumulated in the base region 103.

A reading operation is performed using a method wherein the potential of the emitter region 102 is directly detected using an amplifier or the like or a method wherein a reading switch is connected to the emitter region 102 and the switch is placed in a conducting state to allow the potential to be read into an external load capacity. In the latter case, a part of the carriers accumulated in the base region 103 is lost.

Next, during an extinguishing operation, the MOS transistor 105 is placed in a conducting state. During the period when the MOS transistor 105 is kept in the conducting state, the holes accumulated in the base region 103, which are residual charge, are recombined with electrons injected from the emitter region 102 to the base region 103. When the MOS transistor 105 is placed in the non-conducting state thereafter, the extinguishing operation ends and the next accumulating operation begins.

A description will now be made on the effect of the residual charge in the base region 103 at the time when the extinguishing operation ends. This residual charge can give rise to a residual image because it remains when the next accumulating operation is started. Therefore, the period during which the MOS transistor 105 is in the conducting state must be long enough to eliminate the residual charge sufficiently.

If the residual charge is too small, it is difficult to obtain a sufficient output in a low luminance region, which deteriorates the linearity of the photoelectric conversion characteristics. The reason is that the potential of the emitter region 102 of the bipolar transistor 101 is not increased unless the emitter-base junction is forward-biased to a certain degree. The smaller the capacity of the emitter-base junction, the smaller the amount of charge required to forward-bias the emitter-base junction. Therefore, by reducing the capacitance of the emitter-base junction, desirable linearity of the photoelectric conversion characteristics can be obtained in the low luminance region even if the residual charge is small.

As described above, it is possible to provide a photoelectric converter device in which the generation of residual images is suppressed and which exhibits photoelectric conversion characteristics having high linearity in a low luminance region by expanding the period during which the MOS transistor 105 is kept in a conducting state to a certain degree.

However, conventional photoelectric converter devices have a problem in that residual images become more significant when they are exposed to only a small amount of light. There is another problem in that in response to the incidence of light after a prolonged dark condition, they can not provide output at a level corresponding to the amount of the light.

The above-mentioned problems will be described in detail.

Figure 5:
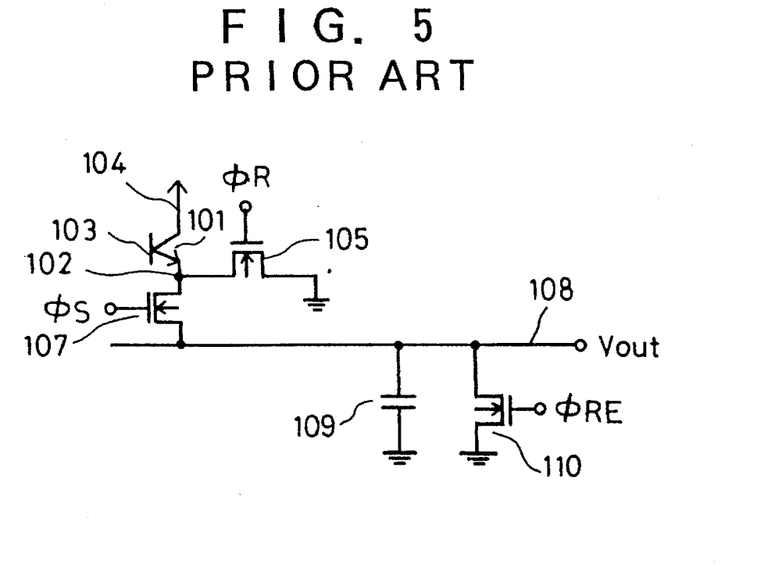
FIG. 5 is a configuration diagram illustrating the operation of one of photoelectric conversion cells of a conventional photoelectric converter device.

FIG. 5 is a configuration diagram illustrating the operation of one photoelectric conversion cell of a conventional photoelectric converter device.

In FIG. 5, an emitter region 102 of an NPN bipolar transistor 101 is connected to a signal line 108 through a reading switch 107. A load capacitor 109 is connected to the signal line 108, and a voltage Vout on the signal line 108 is output. The emitter region 102 can be fixed to a reference voltage (ground) through a MOS transistor 105. The signal line 108 can be connected to the reference voltage (ground) though a signal line reset switch 110.

Figure 6:
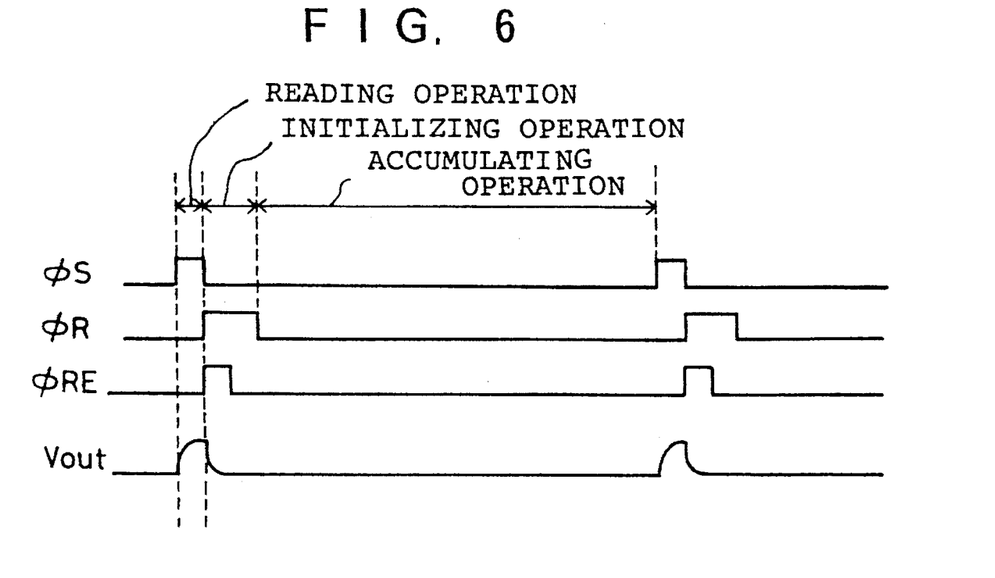
FIG. 6 is a time chart illustrating the operation of the photoelectric conversion cell of the conventional photoelectric converter device shown in FIG. 5.

FIG. 6 is a time chart illustrating the operation of one of the photoelectric conversion cells of the conventional photoelectric converter device. When a positive pulse φS is applied to the reading switch 107, the reading switch 107 enters a conducting state; the base-emitter junction of the NPN bipolar transistor 101- is forward-biased; charges are accumulated in the load capacitor 109; and the voltage Vout is increased (reading operation).

Next, when a positive pulse φR is applied to the MOS transistor 105, the MOS transistor 105 enters a conducting state; the emitter region 102 is fixed to the reference voltage (ground); and excess carriers in base region 103 are removed (extinguishing operation). When a positive pulse φRE is applied to the signal line reset switch 110, that switch enters a conducting state, capacitor 109 is discharged through switch 110 and the voltage Vout becomes equal to the reference voltage (ground).

When the pulse φR ends (the extinguishing operation ends), the next accumulating operation begins wherein carriers are accumulated in the base region 103 in accordance with the amount of the incident light, and the potentials of the base region 103 and the emitter region 102 in a floating state increase.

In order to examine the residual image characteristics of the conventional photoelectric converter device, the following measurement was made with the periods of the accumulating, reading, and extinguishing operations set at 5 msec., 1 μsec, and 1 μsec, respectively.

Figure 7:
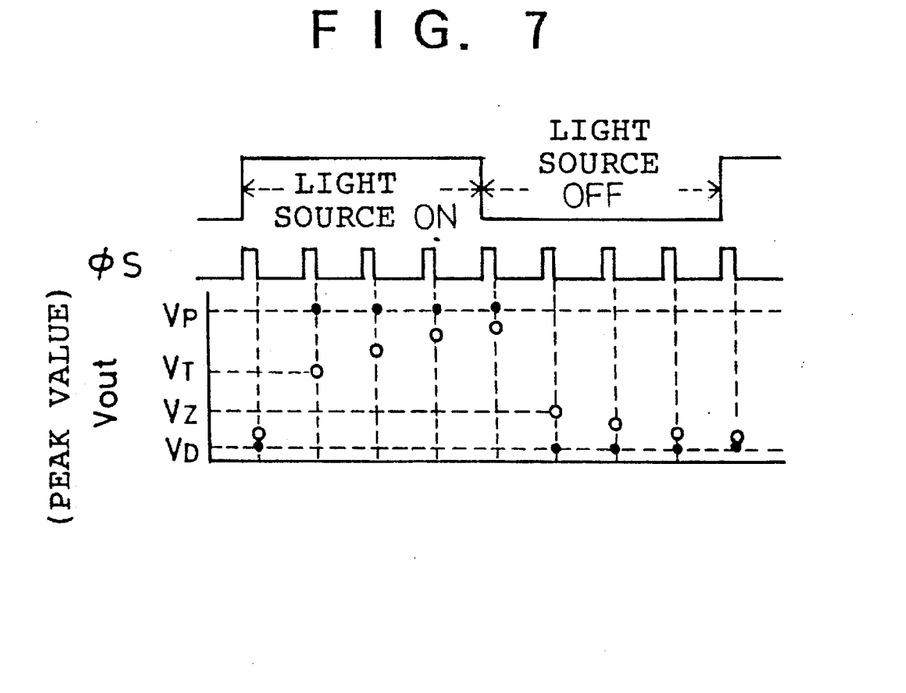
FIG. 7 is a time chart for the measurement of residual images.

FIG. 7 is a time chart for measurement of residual images. The light source was periodically turned on/off in synchronism with the pulses φS, and peak values of the voltage Vout were plotted. Actual measurements indicated by ○ deviated from ideal values indicated by ·. In FIG. 7, VP represents the peak value of the voltage Vout that appeared when the light source was continuously on; VD represents the peak value of the voltage Vout that appeared when the light source was continuously off; VT represents the peak value of the voltage Vout that appeared during the reading operation after the first accumulating operation after the light source was turned on; and VZ represents the peak value of the voltage Vout during the reading operation after the first accumulating operation after the light source was turned off.

Figure 8:
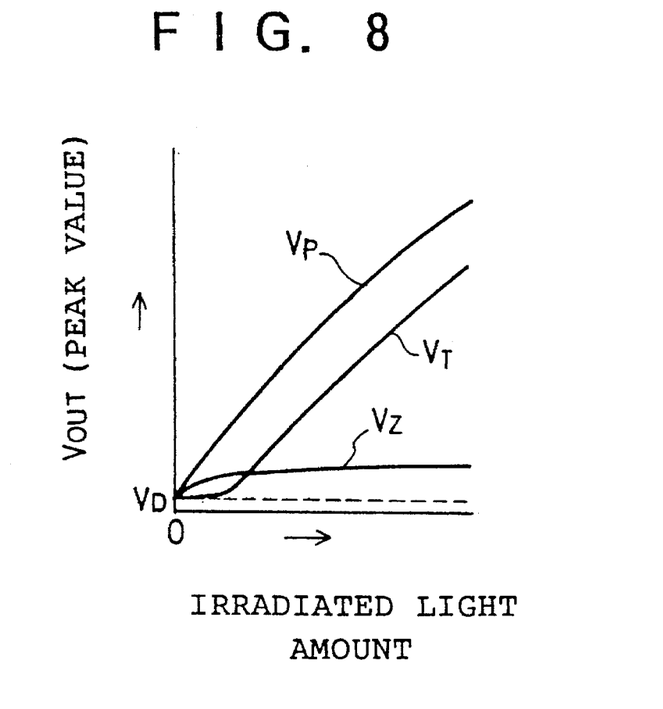
FIG. 8 shows the result of residual image measurement performed on the conventional photoelectric converter device, such as that shown in FIG. 5.

The result of the measurement of residual images is shown in FIG. 8 which indicates how the peak values VP, VT and VZ change with changes in the irradiated light amount when the light source is on.

The magnitude of the peak value VZ is determined by the amount of the excess majority carriers (holes) remaining in the P-type base region 103 after the extinguishing operation. If a high level of forward bias is applied to the base emitter junction (the irradiated light amount is large) during the extinguishing operation, the excess majority carriers (holes) rapidly extinguish as a result of the recombination, the same as for electrons injected from the N-type emitter region 102, and settle at a certain amount. If the level of the forward bias applied to the base-emitter junction is low (the irradiated light amount is small), fewer electrons are injected from the N-type emitter region 102. This makes the recombination in the P-type base region 103 slower and, therefore, suppresses the reduction of the excess majority carriers (holes). As a result, in FIG. 8, the peak value VZ becomes substantially flat after it increases while the irradiated light amount is small.

After repeated extinguishing operations with the light source in the off state, the level of the forward-bias applied to the base-emitter junction is very low. In the next accumulating operation, the light source is turned on, and majority carriers (holes) are accumulated in the P-type base region 103 in an amount corresponding to the amount of incident light. However, a part of the majority carriers (holes) is used for forward-biasing the base-emitter junction and therefore does not contribute to the output. As a result, in FIG. 8, the increase in the peak value VT is very small when the irradiated light amount is small and becomes substantially parallel with the peak value VP after a certain irradiated light amount is exceeded.

A residual image ratio RZ and a potential increase ratio RT are defined as follows.

RZ=(VZ−VD)/(VP−VD)×100[%]

RT=(VT−VD)/(VP−VD)×100[%]

Figure 11:
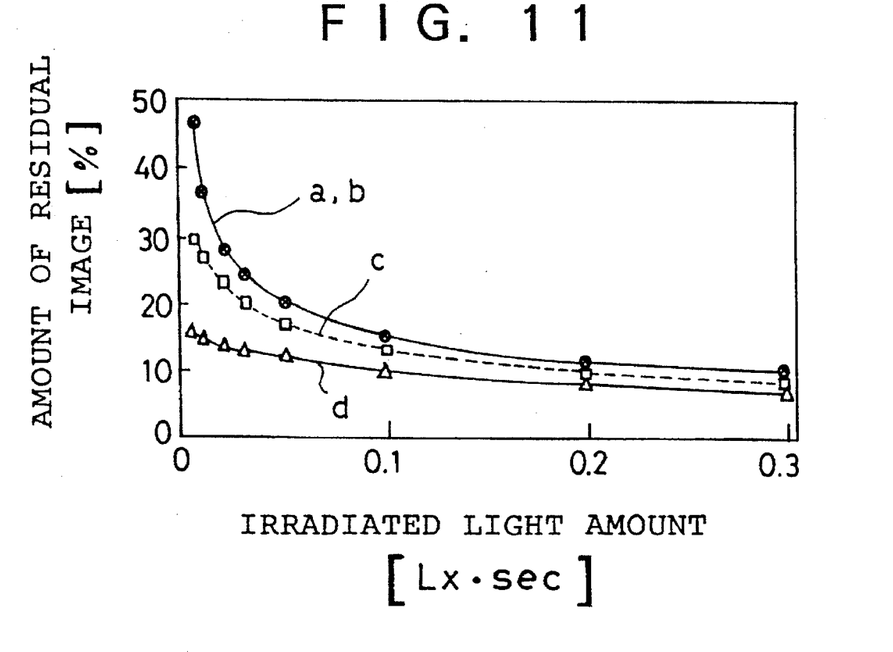
FIG. 11 shows the dependence of a residual image ratio on the irradiated light amount.

The curve "a" obtained by connecting the circles in FIG. 11 indicates the dependence of the residual image ratio RZ obtained from FIG. 8 on the irradiated light amount. The residual ratio RZ is great when the irradiated light amount is small. The curve "e" obtained by connecting the circles in FIG. 12 indicates the dependence of the potential increase ratio RT obtained from FIG. 8 on the irradiated light amount. The potential increase ratio RT is small when the irradiated light amount is small. Thus, the conventional photoelectric converter device has a problem in that its residual image characteristics are significantly deteriorated when used with a small irradiated light amount.

It is an object of the invention to provide a photoelectric converter device and a method for photoelectric conversion which solve the above-described problems.

SUMMARY OF THE INVENTION

According to a first aspect of the present invention, the above-described problem is solved by a photoelectric converter device including a transistor formed by a control electrode region made of a semiconductor of a first conductivity type for accumulating carriers generated by an electromagnetic wave emitted by an object to be detected, a first main electrode region made of a semiconductor of a second conductivity type, and a second main electrode region made of a semiconductor of the second conductivity type, for performing an operation to accumulate the carriers, an operation of reading signals based on the carriers, and an operation of extinguishing the carriers, characterized in that it includes a means for introducing an electromagnetic wave other than the electromagnetic wave emitted by the object to be detected into the control electrode region during the accumulating or reading operation.

According to a second aspect of the present invention, the above-described problems are solved by a photoelectric converter device including a transistor formed by a control electrode region made of a semiconductor of a first conductivity type for accumulating carriers generated by an electromagnetic wave emitted by an object to be detected, a first main electrode region made of a semiconductor of a second conductivity type, and a second main electrode region made of a semiconductor of the second conductivity type, for performing an operation to accumulate the carriers, an operation of reading signals based on the carriers, and an operation of extinguishing the carriers, characterized in that it includes a means for injecting carriers other than the carriers generated by the electromagnetic wave emitted by the object to be detected into the control electrode region during the accumulating or reading operation.

According to a third aspect of the present invention, the above-described problems are solved by a method of photoelectric conversion utilizing a photoelectric converter device including a transistor formed by a control electrode region made of a semiconductor of a first conductivity type, a first main electrode region made of a semiconductor of a second conductivity type, and a second main electrode region made of a semiconductor of the second conductivity type, and including the steps of accumulating carriers generated by an electromagnetic wave emitted by an object to be detected in the control electrode region, reading signals based on the accumulated carriers by forward-biasing a junction between the first main electrode region and the control electrode region, and extinguishing the carriers by placing the first main electrode region in a low impedance state, characterized in that carriers other than the carriers generated by the electromagnetic wave emitted by the object to be detected are injected into the control electrode region during the accumulating or reading step.

In a photoelectric converter device having the above-described configuration, since carriers other than those generated by an electromagnetic wave emitted by an object to be detected are generated in or injected into the control electrode region, the level of the forward-bias applied to the base-emitter junction can be kept high when the extinguishing operation is started. As a result, the excess majority carriers (holes) are rapidly extinguished as a result of the recombination of the same with electrons injected from the emitter region and are settled at a certain amount during the extinguishing operation. Therefore, the amount of the excess majority carriers in the control electrode region after the extinguishing operation is always kept at a substantially constant level regardless of the amount of the electromagnetic wave emitted by the object to be detected. This allows the accumulating operation to be always started in a substantially constant initialized state and therefore improves residual image characteristics significantly. Especially, preferable residual image characteristics can be obtained even when the electromagnetic wave emitted by the object to be detected generates only a small amount of carriers (the irradiated light amount is small).

DESCRIPTION OF THE PREFERRED EMBODIMENTS

The preferred embodiments of the present invention will now be described with reference to the drawings.

Figure 1:
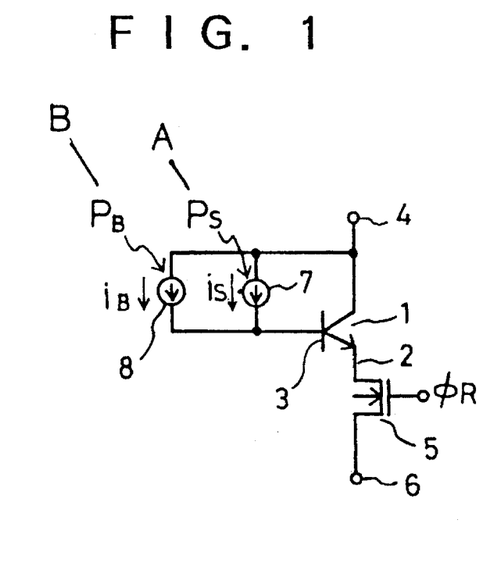
FIG. 1 is an equivalent circuit diagram of a first embodiment of a photoelectric converter device according to the present invention.

FIG. 1 is an equivalent circuit diagram of a first embodiment of a photoelectric converter device according to the present invention.

In FIG. 1, an N-type emitter region 2 which is a first main electrode region of an NPN bipolar transistor 1 is connected to the drain of an N-channel MOS transistor 5. A source electrode 6 of the MOS transistor 5 is connected to ground or a constant voltage source at a low potential. The turning on/off of the MOS transistor 5 is controlled by a signal φR. An N-type collector region 4 which is a second main electrode region is kept at a positive potential. A base region 3 which is a control electrode region is always floating.

It will be assumed that PS represents the amount per unit time of an electromagnetic wave emitted by an object to be detected and directed to the NPN bipolar transistor 1. Then, a current is proportional to the amount PS flows from the collector region 4 to the base regions 3. This is indicated by a virtual current source 7 shown between the collector region 4 and the base region 3. This current source is omitted in the equivalent circuit diagram of a conventional photoelectric converter device shown in FIG. 4.

In the present embodiment, an electromagnetic wave other than that emitted by the object to be detected is directed to the NPN bipolar transistor 1. If it is assumed that PB represents the amount per unit time of this electromagnetic wave, a current iB proportional to the amount PB flows from the collector region 4 to the base region 3. This is indicated by a virtual current source 8 shown between the collector region 4 and the base region 3. The electromagnetic wave other than that emitted by the object to be detected is generated by a light source or the like and is directed to the bipolar transistor 1 using a reflector or a half mirror if necessary. The magnitude of the amount PB can be controlled using an ND filter or the like.

The operation of this photoelectric converter device will now be described.

First, an accumulating operation starts when the MOS transistor 5 is placed in a non-conducting state (t=O). At this time, the emitter region 2 is in a floating state at a ground potential, and the base region 3 is set in a floating state at a positive potential. Let us assume that QB(O) represents the amount of excess carriers (holes) in the base region 3. In this state, an electromagnetic wave having a magnitude PS and an electromagnetic wave having a magnitude PB are radiated from the object to be detected and the light source or the like, respectively. This results in the flow of the currents iS and iB from the collector region 4 to the base region 3 and, hence, accumulation of carriers (holes) in the base region 3. Let us assume that T represents the length of the period of the accumulating operation. Then, the amount QB(T) of excess carriers (holes) in the base region 3 at the end of the accumulating operation is as follows.

$$QB(T) = BQ(0) + \int_0^T (iS + iB)dt \tag{1}$$

If the amount PB is constant during the accumulating operation, the current iB is also constant. Therefore, the following equation can be derived.

$$QB(T) = QB(0) + \int_0^T iS\, dt + iB\, T \tag{2}$$

If the amount PS=0 during the accumulating operation, then iS=0. Therefore, the following equation can be derived from Equation 1.

$$QB(T) = QB(0) + \int_0^T iS\, dt \tag{3}$$

The magnitude of $$\int_0^T iB\, dt$$

is always kept constant during each cycle of the repeated accumulating, reading, and extinguishing operations. This can be achieved by always keeping the light source or the like for generating the electromagnetic wave other than that emitted by the object to be detected in an ON state to produce constant luminosity, thereby keeping the amount PB constant. Alternatively, this can be achieved by generating the electromagnetic wave other than that emitted by the object to be detected as a pulse in synchronism with the above-mentioned cycles.

A reading operation is performed using a method wherein the potential of the emitter region 2 is directly detected using an amplifier or the like or a method wherein a reading switch is connected to the emitter region 2 and the switch is placed in a conducting state to allow the potential to be read into an external load capacitor. In the latter case, a part of the carriers accumulated in the base region 3 is lost. In either case, the value of the read output depends on QB(T).

Next, during an extinguishing operation, the MOS transistor 5 is placed in a conducting state. During the period when the MOS transistor 5 is kept in the conducting state, the holes accumulated in the base region 3 which are residual charge are eliminated as a result of the recombination of the same with electrons injected from the emitter region 2 to the base region 3. When the MOS transistor 5 is placed in the non-conducting state thereafter, the extinguishing operation ends and the next accumulating operation begins.

The amount PB is controlled so as to keep the amount $$\int_0^T iBdt$$

above a certain level. Therefore, even if PS=0 during the accumulating operation, a great number of excess carriers (holes) are present in the base region 3 when the extinguishing operation is started. Thus, the forward bias applied to the base-emitter junction is above a certain level when the extinguishing operation is started. Therefore, the excess carriers (holes) in the base region 3 is rapidly extinguished as a result of the recombination of the same with electrons injected from the emitter region and settle at a certain amount. Thus, the amount of the excess majority carriers in the control electrode region after the extinguishing operation is always at a substantially constant level QB(O) regardless of the amount of the electromagnetic wave emitted by the object to be detected. This allows the accumulating operation to be always started in a substantially constant initialized state and therefore greatly improves residual image characteristics. Especially, desirable residual image characteristics can be obtained even when the amount of the carriers generated by the electromagnetic wave emitted by the object to be detected is small.

In the foregoing description, the injection of carriers by the light source for generating the electromagnetic wave other than that emitted by the object to be detected takes place during the accumulating operation. When the light source is always used in an on state, the injection of carriers takes place also during the reading operation. The same effect can be provided by injecting carriers during the accumulating or reading operation with the light source turned on for a short period of time. This is because a great number of excess carriers (holes) are present in the base region 3 at the beginning of the extinguishing operation in any case.

The measurement as shown in FIGS. 6 and 7 was carried out on this photoelectric converter device under the same conditions as those for the conventional photoelectric converter device. A light source A was periodically turned on and off in synchronism with the signal φS as shown in FIG. 7 with the periods of the accumulating, reading, and extinguishing operations set at 5 msec, 1 μsec, and 1 μsec, respectively. PS(ON) represents the amount per unit time of the electromagnetic wave directed from the light source A to the NPN bipolar transistor 1 when the light source A is on. Further, in this photoelectric converter device, a constant electromagnetic wave is directed to the NPN bipolar transistor 1 from a light source B which is always in an on state. The amount per unit time of the electromagnetic wave directed from the light source B to the NPN bipolar transistor 1 corresponds to the above-mentioned amount PB.

Figure 9:
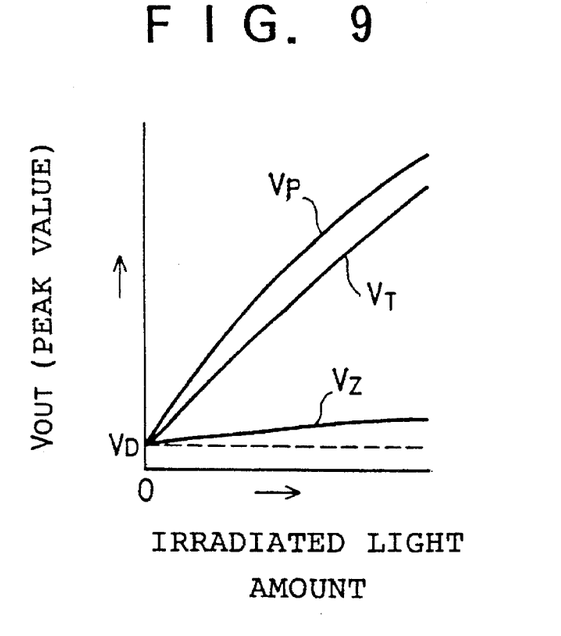
FIG. 9 shows the result of residual image measurement performed on a photoelectric converter device according to the resent invention.
Figure 10:
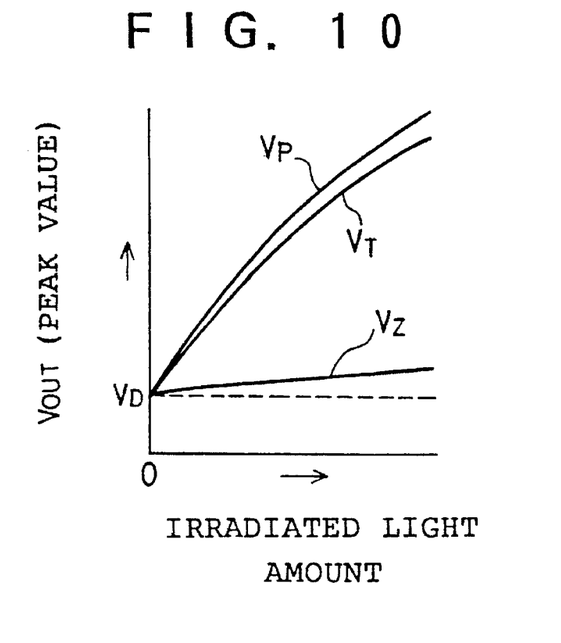
FIG. 10 shows the result of residual image measurement performed on a photoelectric converter device according to the present invention.

The results of the measurement are shown in FIGS. 9 and 10. The horizontal axes of those figures represent the magnitude of the irradiated light amount PS (ON)·T provided by the light source A when the light source A is on. FIG. 9 shows the result obtained when the irradiated light amount PB·T=0.01·T [Lx·sec] while FIG. 10 shows the result obtained when the irradiated light amount PB·T=0.03·T [Lx·sec]. When PB·T=0 [Lx·sec], the characteristics coincide with those shown in FIG. 8 which are the characteristics of a conventional photoelectric converter device. It is apparent that the peak values VZ and VT become closer to the peak values VD and VP, respectively, as the irradiated light amount PB·T provided by the light source B becomes greater. Further, the greater the irradiated light amount PB·T provided by the light source B, the greater the peak value VD. The peak value VD is an output which is obtained from only the electromagnetic wave applied by the light source B.

Figure 12:
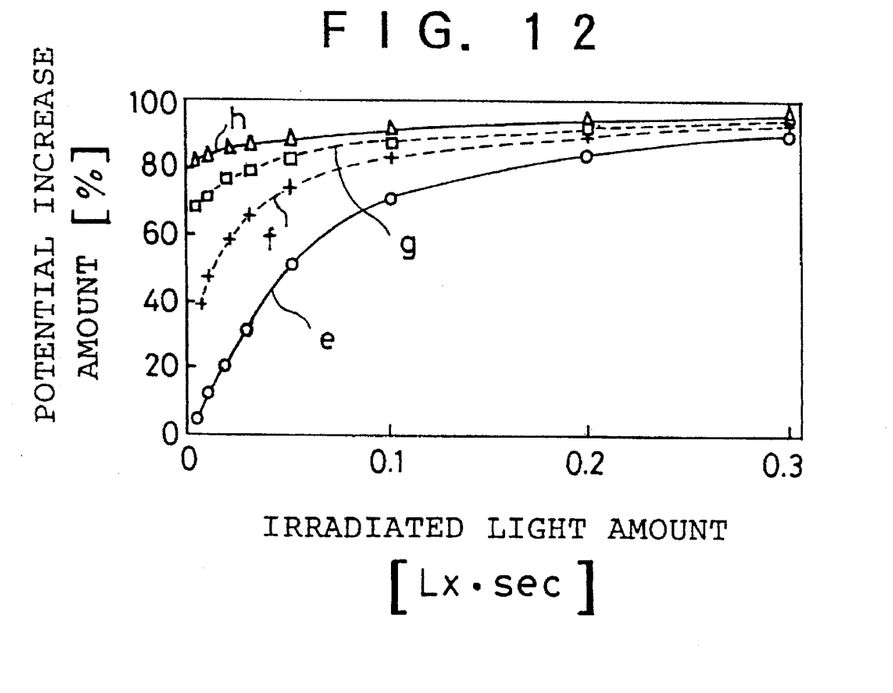
FIG. 12 shows the dependence of a potential increase ratio on the irradiated light amount.

The dependence of a residual image ratio RZ on the irradiated light amount is as indicated by the curve "b" marked by +, the curve "c" marked by □, and the curve "d" marked by Δ in FIG. 11. The dependence of a potential increase ratio RT on the irradiated light amount is as indicated by the curve "f" marked by +, the curve "g" marked by □, and the curve "h" marked by Δ in FIG. 12. The horizontal axes in FIGS. 11 and 12 represent the magnitude of the irradiated light amount PS(ON)·T provided by the light source A when the light source A is on. The curve "b" in FIG. 11 and the curve "f" in FIG. 12 are obtained when the irradiated light amount provided by the light source B is PB·T=0.003·T [Lx·sec]. The potential increase ratio has been improved from that in the conventional photoelectric converter device, although there is no change in the residual image ratio. The curve "c" in FIG. 11 and the curve "g" in FIG. 12 are obtained when the irradiated light amount provided by the light source B is PB·T=0.01·T [Lx·sec]. The curve "d" in FIG. 11 and the curve "h" in FIG. 12 are obtained when the irradiated light amount provided by the light source B is PB·T=0.03·T [Lx·sec]. Thus, improved residual image characteristics are obtained even when the irradiated light amount is small.

Figure 2:
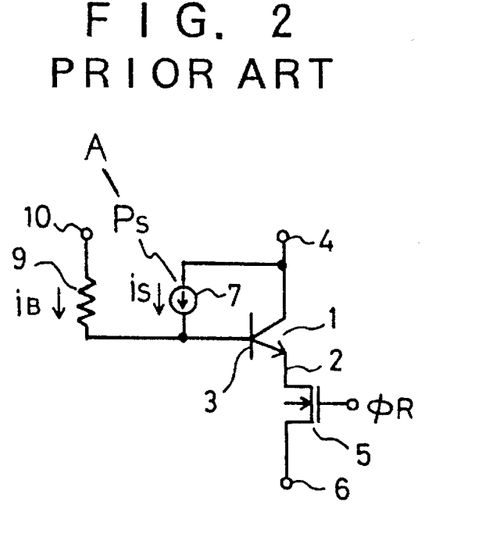
FIG. 2 is an equivalent circuit diagram of a second embodiment of a photoelectric converter device according to the present invention.

FIG. 2 is an equivalent circuit diagram of a second embodiment of a photoelectric converter device according to the present invention.

This circuit is obtained by deleting the virtual current source 8 from FIG. 1 which is an equivalent circuit diagram of the first embodiment and by adding a resistance element 9 to the same circuit. One of the terminals of the resistance element 9 is connected to the base region 3 of the NPN bipolar transistor 1, and the other terminal 10 is maintained at a positive potential VB. This potential may be shared by the collector 4. The current flowing into the base region 3 through the resistance element 9 is represented by iB. When the potential of the base region 3 is lower than the potential VB, the current iB is positive. Therefore, the present embodiment provides the same characteristics as in the first embodiment without the light source or the like for generating the electromagnetic wave other than that emitted by the object to be detected.

The current iB must be set at an appropriate magnitude because no significant improvement of residual image characteristics can be obtained if the current is too small and the dynamic range is reduced if it is too large. For example, in order to set the current iB in the range from several picoamperes to several hundred picoamperes, the resistance of the resistance element 9 must be of the order of between several tens of gigaohms to several thousand gigaohms. The resistance element 9 can be formed using a normal semiconductor fabrication process. For example, if the resistance element 9 is formed using polysilicon wiring, the amount of impurities doped using ion implantation can be controlled so that the desired resistance can be obtained.

Figure 3:
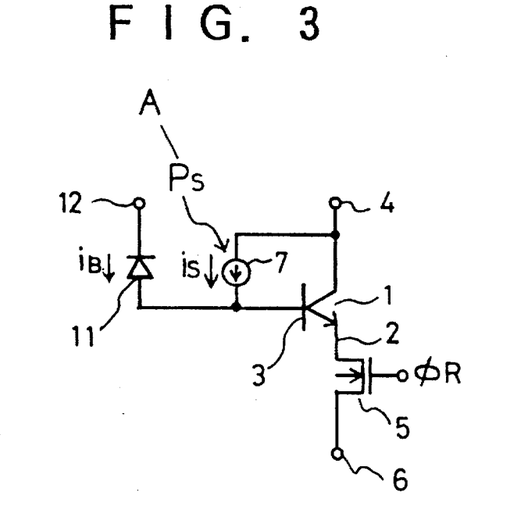
FIG. 3 is an equivalent circuit diagram of a third embodiment of a photoelectric converter device according to the present invention.

FIG. 3 is an equivalent circuit diagram of a third embodiment of a photoelectric converter device according to the present invention.

This device is provided by replacing the resistance element 9 in FIG. 2, which is an equivalent circuit diagram of the second embodiment, with a diode 11. The P-region of the diode 11 is connected to the base region 3 of the NPN transistor 1, and the N-region 12 thereof is kept at a positive potential VB. This potential may be shared by the collector 4. When the potential of the base region 3 is lower than the potential VB, a leakage current Ib in the reverse direction of the diode 11 flows into the base region 3. This current functions similarly to the current generated as a result of the irradiation with an electromagnetic wave other than that emitted by the object to be detected in the first embodiment. Therefore, the present embodiment provides the same characteristics as in the first embodiment without the light source or the like for generating an electromagnetic wave other than that emitted by the object to be detected.

The P-region of the diode 11 may be part of, or integral with, the base region 3. The N-region of the diode 11 may be part of, or integral with, the collector 4. The densities and joining areas of the P- and N-regions of the diode 11 are set so that the current iB becomes a desired value.

According to the present invention, a linear sensor or an area sensor having desirable residual image characteristics can be provided simply by replacing a photoelectric conversion element of a conventional photoelectric converter device with an element as shown in FIGS. 2 and 3. In addition, a linear sensor or an area sensor having desirable residual image characteristics can be provided if a conventional photoelectric converter device is supplemented with a means for directing an electromagnetic wave other than an electromagnetic wave emitted by an object to be detected to a photoelectric conversion element thereof.

The bipolar transistor 1 in the foregoing description may be a PNP type transistor. Further, an FET or SIT may be used. The MOS transistor 5 may be a P-channel type transistor or may be replaced with other types of switching devices.

As described above, according to the present invention, in a photoelectric converter deice including a transistor formed by a control electrode region made of a semiconductor of a first conductivity type for accumulating carriers generated by an electromagnetic wave emitted by an object to be detected, a first main electrode region made of a semiconductor of a second conductivity type, and a second main electrode region made of a semiconductor of the second conductivity type, for performing an operation to accumulate the carriers, an operation of reading signals based on the carriers, and an operation of extinguishing the carriers, carriers other than those generated by the electromagnetic wave emitted by the object to be detected are generated in or injected into the control electrode region. Thus, the amount of excess majority carriers in the control electrode region after the extinguishing operation can always be set to a substantially constant level. That is, residual image characteristics are greatly improved. Especially, desirable residual image characteristics can be provided even when the amount of the carriers generated by the electromagnetic wave emitted by the object to be detected is small, i.e. the irradiated light amount is small.

This application relates to subject matter disclosed in Japanese Application number 7-063229, filed on Mar. 22, 1995, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. In a photoelectric converter device comprising a transistor containing a control electrode region made of a semiconductor of a first conductivity type for accumulating carriers generated by an electromagnetic wave emitted by an object to be detected, a first main electrode region made of a semiconductor of a second conductivity type, and a second main electrode region made of a semiconductor of the second conductivity type, for performing an operation to accumulate the carriers, an operation of reading signals based on the carriers, and an operation of extinguishing the carriers, the improvement comprising a means for introducing an electromagnetic wave other than the electromagnetic wave emitted by the object to be detected into said transistor during the accumulating or reading operation.

2. In a photoelectric converter device comprising a transistor containing a control electrode region made of a semiconductor of a first conductivity type for accumulating carriers generated by an electromagnetic wave emitted by an object to be detected, a first main electrode region made of a semiconductor of a second conductivity type, and a second main electrode region made of a semiconductor of the second conductivity type, for performing an operation to accumulate the carriers, an operation of reading signals based on the carriers, and an operation of extinguishing the carriers, the improvement comprising a means for injecting carriers other than the carriers generated by the electromagnetic wave emitted by the object to be detected into said control electrode region during the accumulating or reading operation.

3. The photoelectric converter device according to claim 2, wherein said means for injecting carriers into the control electrode region includes a resistance element electrically connected to said control electrode region and a voltage source connected to said resistance element.

4. The photoelectric converter device according to claim 2, wherein said means for injecting carriers into the control electrode region includes a diode connected to a voltage source for injecting a leakage current in the reverse direction of the diode into said control electrode region.

5. A method of photoelectric conversion utilizing a photoelectric converter device having a transistor, the transistor having a control electrode region made of a semiconductor of a first conductivity type, a first main electrode region made of a semiconductor of a second conductivity type, and a second main electrode region made of a semiconductor of the second conductivity type, the method comprising the steps of:

accumulating, in the control electrode region, carriers generated by an electromagnetic wave emitted by an object to be detected;

reading signals based on said accumulated carriers by forward-biasing a junction between said first main electrode region and said control electrode region;

extinguishing said carriers by placing said first main electrode region in a low impedance state; and injecting carriers other than said carriers generated by the electromagnetic wave emitted by said object to be detected into said control electrode region during at least one of said accumulating and reading step.

\* \* \* \* \*